United States Patent [19]

Yamada

[11] 4,393,482
[45] Jul. 12, 1983

[54] SHIFT REGISTER

[75] Inventor: Kunihiro Yamada, Tokyo, Japan

[73] Assignee: Ricoh Company, Ltd., Tokyo, Japan

[21] Appl. No.: 204,923

[22] Filed: Nov. 7, 1980

[30] Foreign Application Priority Data

Nov. 8, 1979 [JP] Japan .................................. 54-144838
Nov. 8, 1979 [JP] Japan .................................. 54-144839

[51] Int. Cl.³ .............................................. G11C 8/00
[52] U.S. Cl. ...................................... 365/236; 365/78
[58] Field of Search ............... 365/230, 231, 236, 238, 365/240, 78, 189; 307/221 R; 328/37

[56] References Cited

U.S. PATENT DOCUMENTS 4,280,199  7/1981  Osakabe et al. ...................... 365/236

FOREIGN PATENT DOCUMENTS

54-43630  4/1979  Japan .................................. 365/236
1542267   3/1979  United Kingdom .................. 365/78

Primary Examiner—Joseph A. Popek
Attorney, Agent, or Firm—Oblon, Fisher, Spivak, McClelland & Maier

[57] ABSTRACT

A shift register of the type capable of performing shift operations by changing the access of a random access memory, which is capable of performing the operations at a high speed, with respect to the address for reading data and the output of a counter, the input to which is a clock pulse. In order to increase the operations of the shift register, the operation of the address is performed in a power form or each input data is written at two different addresses of the random access memory.

5 Claims, 13 Drawing Figures

SHIFT REGISTER

BACKGROUND OF THE INVENTION

1. Field of the Invention

The present invention relates to a shift register and more particularly to a shift register employing a RAM (Random Access Memory) of great capacity and capable of performing high speed operations.

2. Description of the Prior Art

In general, shift registers are capable of moving the contents of information registered therein leftwardly or rightwardly by a predetermined number of steps while retaining that information therein.

The following are the representative types of conventional shift registers: (1) shift registers employing flip-flops, (2) shift registers employing RAM's (Random Access Memories) and (3) dynamic shift registers.

Figure 1:
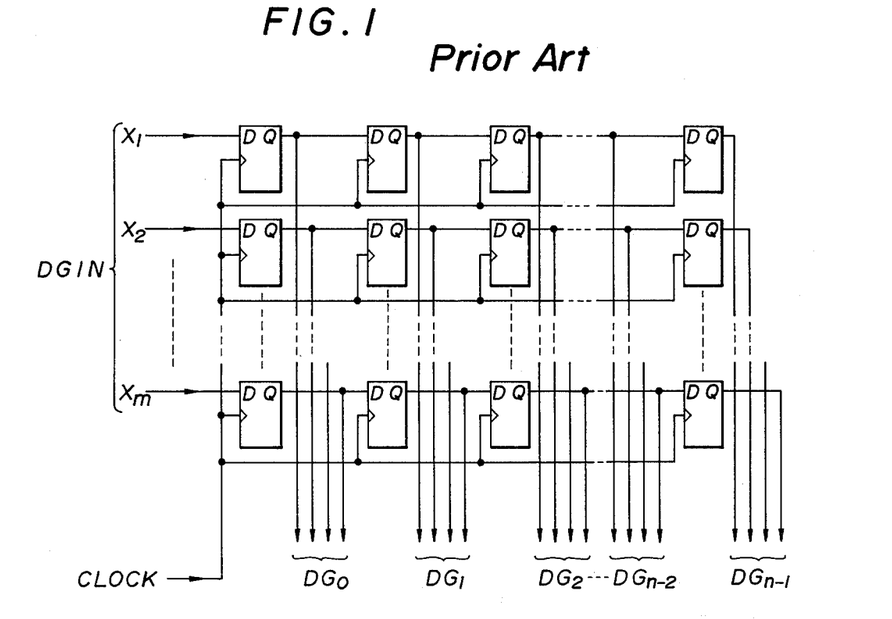
FIG. 1 is a block diagram of a conventional shift register employing flip-flops.

Referring to FIG. 1, there is shown the construction of a shift register of the type employing flip-flops arranged in a matrix of m rows and n columns for registering words, each word consisting of m bits. When inputs DG IN of $X_l \sim X_m$ are applied to the shift register, their registering positions are moved to the registers in the next column each time a clock pulse CLOCK is applied to the shift register. By taking out the set output from each flip-flop in each column, one word consisting of m bits can be obtained. As a result, n words, $DG_o$, $DG_1$, $DG_2$, ... $DG_{n-2}$, $DG_{n-1}$, can be obtained whenever the clock pulse CLOCK is input to the shift register.

In operation, when a clock pulse CLOCK is input to the shift register, input DG IN is output in the form of output $DG_o$, and when the next clock pulse CLOCK is input to the shift register, output $DG_1$ becomes equal to the output $DG_o$ produced by the first-mentioned clock pulse CLOCK. Stated differently, the first output $DG_o$ is shifted to the register in the next column and is output in the form of output $DG_1$. Any output $DG_i$, therefore, is output by the clock pulse i pulses prior to the clock pulse i.

The shift register shown in FIG. 1 has a shortcoming in that multiple flip-flops have to be connected to each other.

In a shift register of the type employing a RAM, such a RAM as can store n words therein, each word consisting of m bits, is employed. In a shift register of the type described, if the number of bits for each word in the capacity of the RAM is greater than m or if the number of words that can be stored in the RAM is greater than n, use of only part of the RAM will do.

Figure 2:
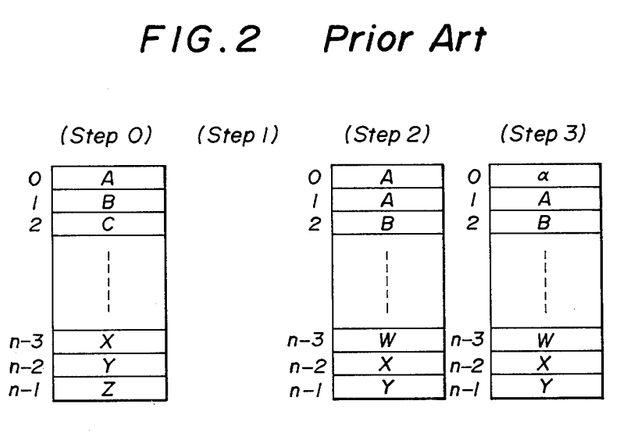
FIG. 2 is a diagram in explanation of the operation of a conventional shift register employing a RAM.

When the addresses of the RAM are assumed to be 0 to n−1 as shown in FIG. 2, and the contents of the RAM are as shown in FIG. 2 before a clock is input thereto, the RAM is in the standby state, waiting for the input of the clock pulse thereto in Step 1. Further, when the input data at the input of the clock pulse is assumed to be α, in Step 2, the content at address n−2 is transferred to address n−1, the content at address n−3 is transferred to address n−2, and the content at address n−4 is transferred to address n−3 and the content at address 0 is likewise transferred to address 1, whereby the contents of the RAM become as shown in Step 2 in FIG. 2. Finally, in Step 3, the input data α is stored at address 0. The same results can be obtained by reversing the order of Step 1 and Step 2.

Figures 3, 5:
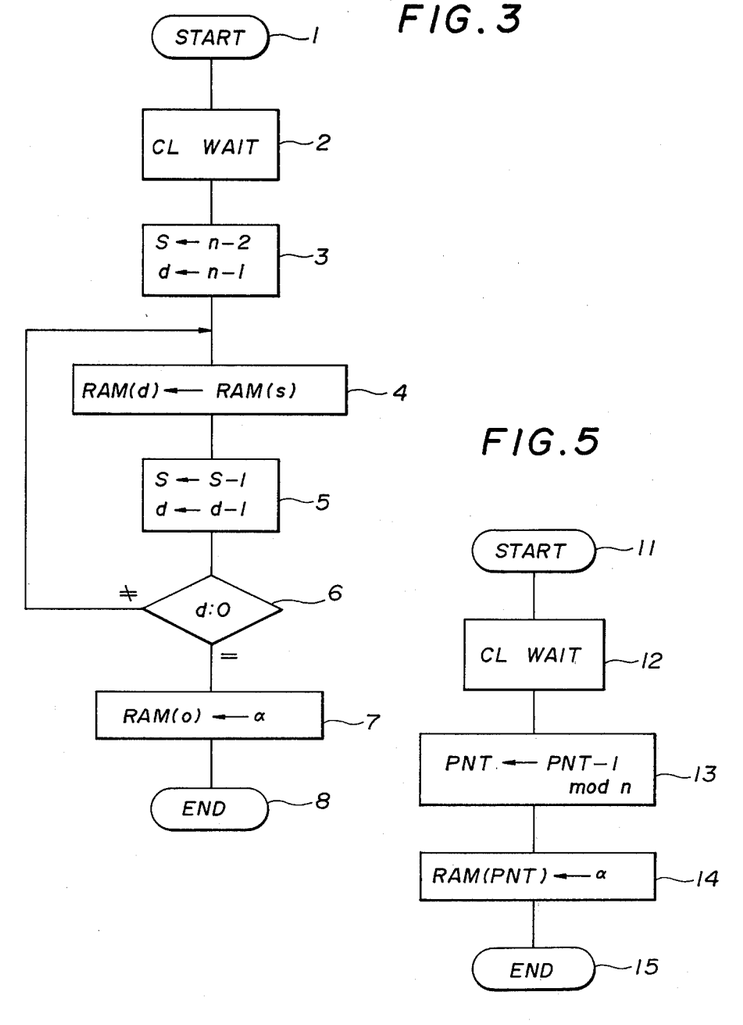
FIG. 3 is a flow chart in explanation of all the operation steps of the shift register in FIG. 2.
FIG. 5 is a flow chart in explanation of all the operation steps of the shift register in FIG. 4.

Referring to FIG. 3, there is shown a flow chart of all the steps in FIG. 2. In FIG. 3, after waiting for the input of a clock pulse at Stage 2, it is supposed that at Stage 3 the address of the RAM designated by a source address counter is n−2 and that the address of the RAM designated by a destination address counter is n−1. At Stage 4, the content at the address of the RAM designated by the source address counter is transferred to the address of the RAM designated by the destination address counter. At Stage 5, 1 is subtracted from the address indicated by the source address counter and from the address indicated by the destination address counter. After reducing the addresses, it is judged whether or not the address indicated by the address destination counter is 0 at Stage 6. If the address is not 0, the operation procedure is returned to Stage 4 and the above-mentioned operation is repeated. If the address is 0, the input data α is stored in address 0 at Stage 7.

Thus, in the shift register of the type described, any RAM can be employed if its capacity is enough. However, when the number of shift stages, n, is great, a long transfer time is required for shifting the contents of the RAM one address by one address.

Another method of using a shift register with a RAM is by changing the access procedure of the RAM, in which a shift operation is substantially effected without shifting the contents of the RAM.

Figure 4:
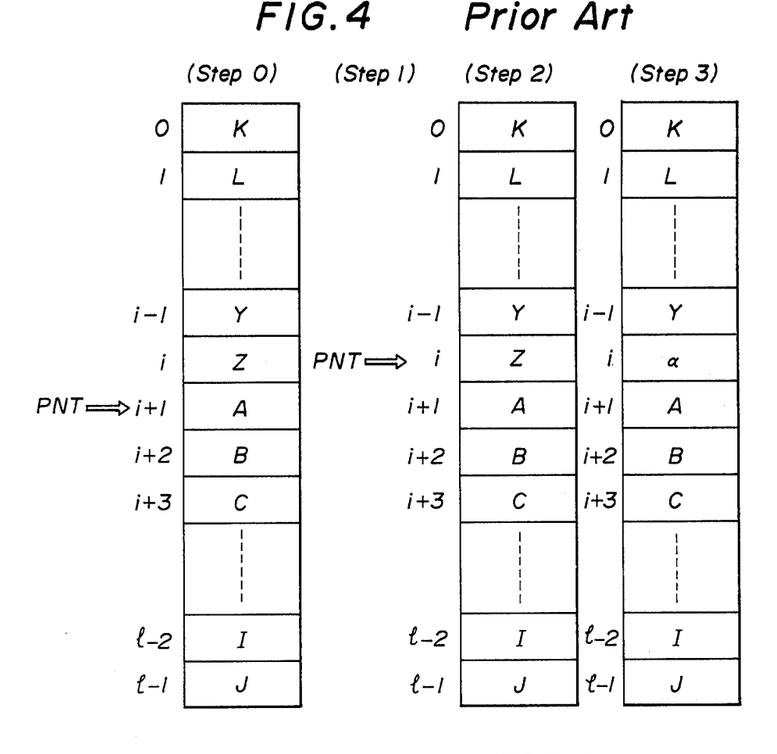
FIG. 4 is a diagram in explanation of the operation of a conventional shift register in which the RAM access procedure is changed.

Referring to FIG. 4, there is shown a diagram in explanation of effecting the shift operation by changing the access procedure of the RAM. FIG. 5 is a flow chart showing all the steps in FIG. 4.

In Step 0 in FIG. 4, the contents of the RAM are assumed to be in the state of a clock pulse not having been input to the RAM yet, and with a pointer indicating address i+1. The pointer PNT can designate each of the addresses 0 to l−1 where $n \leq l = 2^k$.

In Step 1, the RAM is in the state of waiting for a clock pulse. When a clock pulse is input to the RAM, the input data α is supplied to the RAM.

In Step 2, the address number indicated by the pointer PNT is reduced by one, changing from i+1 to i. This subtraction is performed in accordance with modulo n.

In Step 3, the input data is stored in the address (address i) designated by the pointer PNT.

As shown in FIG. 5, Stage 12 is the state of waiting for the input of a clock pulse. At Stage 13, 1 is subtracted from the address indicated by the pointer PNT in accordance with modulo n. At Stage 14, the input data α is stored in the address of the RAM designated by the pointer PNT.

Suppose that the address indicated by the pointer PNT is i, the data at the address j clock pulses prior to the address i is the data stored at the address [i+j modulo l].

Thus, in the method of changing the access procedure, the shifting operation is performed by shifting the pointer PNT, without performing block transfer of the contents of the RAM. However, the operation of [modulo l] is required in order to have access of the actually shifted data. Therefore, this method is not suitable for high speed operations.

As conventional dynamic shift registers, two types are known. One is of the type employing a conventional MOS (Metal Oxide Semiconductor) circuit and the other is of the type employing a CCD (Charge Coupled Device).

Figure 6:
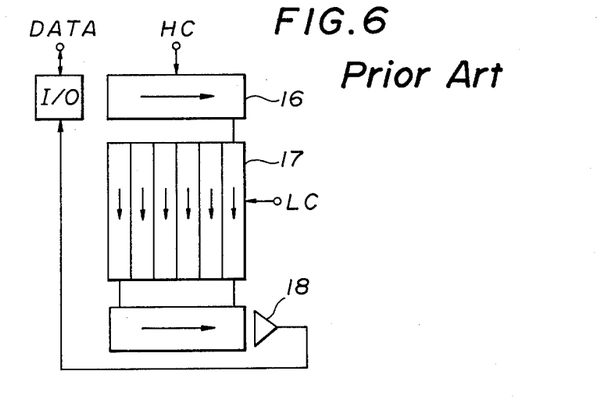
FIG. 6 is a block diagram of an example of a conventional dynamic shift register.

Referring to FIG. 6, there is shown a dynamic shift register of a CCD serial-parallel-serial (SPS) type. This dynamic shift register comprises a serial CCD shift register 16 for transferring signal charges at a high speed and a parallel CCD shift register 17 for transferring signal charges at a low speed.

In this shift register, the data transfer speed depends upon the signal-charge-transfer-speed of the serial CCD shift register 16. A high speed clock HC and a low speed clock LC are respectively applied to the serial CCD shift register and the parallel CCD shift register. Data DATA is input or output by an I/O device, while the refresh operation is performed by a regenerative circuit 18.

The dynamic shift registers of the type described have a limitation in that retarding and stopping of clock pulses cannot be performed.

SUMMARY OF THE INVENTION

It is therefore an object of the present invention to provide a shift register which is made simple in mechanism and inexpensive by use of a RAM of great capacity and which is capable of performing high speed operations and stopping the supply of clocks, and from which the above-described drawbacks in the prior-art shift registers have been successfully eliminated.

In order to attain this object, an embodiment of a shift register according to the present invention comprises a Random Access Memory (RAM) with a capacity of more than $2^k$ words, a k-bit counter which is counted down each time a clock pulse is input thereto and designates an address of the RAM in accordance with the counted value, at which address an input data is written, and an operation unit for adding the address indicated by the k-bit counter to the address of the shifted data to be read, making the added address the address of the data to be read by the RAM, thereby outputting the data which has been shifted by the number of steps corresponding to the number of clock pulses applied by that time, when a clock pulse is not input to the shift register.

Furthermore, in order to attain the above-mentioned object, another embodiment of a shift register according to the present invention comprises a RAM with a capacity of more than 2n words, a counter, an operation unit, a constant generation apparatus and a sequence control apparatus. In this embodiment, when a clock pulse is input thereto, a constant 0 and a constant n are generated by the constant generation apparatus under the control of the sequence control signal generation apparatus, and the output of the counter and the constants are operated by the operation device, preparing their respective addresses for writing the input data in the RAM. When a clock pulse is not input to the shift register, the constant is not generated by the constant generation apparatus, and the address of the shifted data is input to the operation unit as it is, thereby preparing the address for reading the shifted data from the RAM.

DETAILED DESCRIPTION OF THE PREFERRED EMBODIMENT

Figure 7:
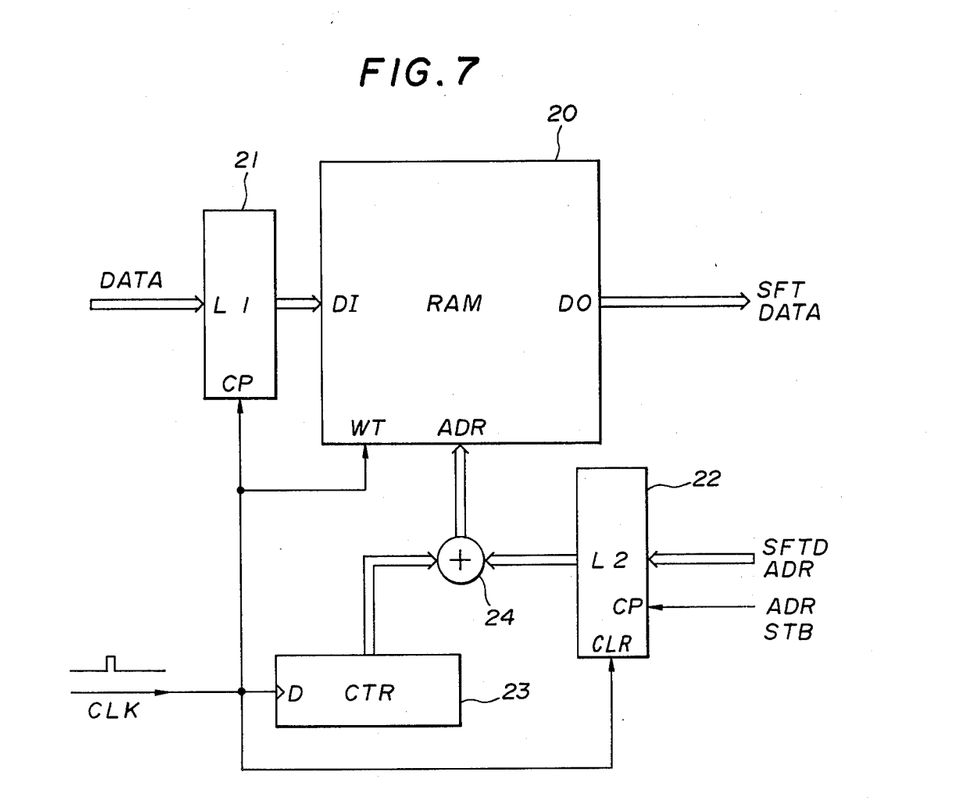
FIG. 7 is a block diagram of an embodiment of a shift register according to the present invention.

Referring to FIG. 7, there is shown the construction of an embodiment of a shift register according to the present invention. In this embodiment, calculation of modulo n is required as in the case of the shift register shown in FIG. 4.

In $n=2^k$ (where n is a positive integer), the calculation of modulo n is significantly simplified by use of lower k-bits of a binary numerical value.

Therefore, as a pointer PNT, a down-counter of k-bits is employed, and as a modulo-n-adder for calculating the address of the data j clock pulses prior to the instant clock pulse, that is, [PNT+j modulo n], an adder of k-bits can be employed for input and output.

Alternatively, only the lower k-bits can be used by AND gates or the like.

In general, the number of stages of a shift register, 1, cannot always be represented by use of $2^k$. Stated differently, in general, $n \leq 2^k$. Therefore, in this embodiment, l is employed, which satisfies the relation of $n \leq l = 2^k$, whereby the calculation of modulo l can be simplified.

Therefore, in the shift register shown in FIG. 7, such a RAM as can store n words therein is not employed, but a RAM that can store l words therein is employed as RAM 20. Further, as the pointer PNT, such a down-counter as can designate addresses 0 to n−1 is not employed, but a down-counter that can designate addresses 0 to l−1 is employed.

In FIG. 7, a latch 21 is a latch circuit of m bits, which is capable of latching the input data DATA when a clock CLK is input to a CP terminal of the latch 21. The input data DATA latched by the latch 21 is input to a DI terminal of the RAM 20. A latch 22 is a latch circuit of k or less bits, which is capable of latching the address SFTD ADR of the shifted data when an address strobe signal ADRSTB is input to a CP terminal of the latch 22. The address SFTD ADR of the shifted data signifies the address necessary for outputting the data i clock pulses prior to the instant clock pulse, from an output terminal DO of the RAM 20 when it is assumed that the data to be read is the data i clock pulses prior to the instant clock pulse. The address SFTD ADR of the shifted data is in binary expression.

Furthermore, the latch 22 is provided with a clear-terminal CLR and when the clock pulse CLK is input to the clear-terminal CLR, the data latched by the latch 22 is cleared.

A counter 23 is a binary counter of k bits, which is counted down one by one each time the clock pulse CLK is input thereto. The counter 23 is designed in such a manner that when the next clock pulse CLK is input to the counter 23 under the condition that the count value of the counter 23 is "0," the next count value of the counter 23 becomes "$2^k-1$."

An adder 24 is a k-bit adder for both input and output. When an output signal from the counter 23 and an output signal from the latch 22 are input to the adder 24, those output signals are added and the addition result is input to an address-terminal ADR of the RAM 20. The adder 24 is constructed so as to be capable of neglecting the overflow of the addition result.

The RAM 20 has a capacity of storing $l(=2^k)$ words with an m-bit word length. When no clock pulse CLK is input to a write-terminal WT of the RAM 20, the data stored at the address designated by the address-terminal ADR is output from the data output-terminal DO of the RAM 20. On the other hand, when a clock pulse CLK is input to the write-terminal WT of the RAM 20, the data which is input to the data-input-terminal DI is written at the address designated by the address-terminal ADR.

When a clock pulse CLK is input to the counter 23, the count value of the counter 23 is decreased by one and this decrement count value corresponds to the address designated by the pointer PNT.

At the same time, the clock pulse CLK is input to the clear-terminal CLR of the latch 22, whereby the latch 22 is cleared and the output from the latch 22 becomes zero.

Therefore, immediately after the clock pulse CLK is input to the counter 23, the output of the counted-down counter 23 and the output "0" of the cleared latch 22 are input to the adder 24 and those outputs are added. Consequently, the output of the counted-down counter 23 is output from the adder 24 and input to the address-terminal ADR of the RAM 20.

The clock pulse CLK is also input to the clock-terminal CP of the latch 21 and to the write-terminal WT of the RAM 20. When the clock pulse CLK is input to the clock-terminal CP of the latch 21, the input data DATA input at that moment is latched by the latch 21, and the latched input data DATA is transferred to the data-input-terminal DI of the RAM 20. At the same time, the clock pulse CLK is also input to the write-terminal WT of the RAM 20. Therefore, the moment the clock pulse CLK is input to the write-terminal WT of the RAM 20, the RAM 20 starts writing of the input data DATA. At that moment, since the output of the counter 23 which is counted down by the same clock pulse CLK is also input to the address-terminal ADR of the RAM 20, the input data DATA is written at the address of the RAM 20 indicated by the counted-down counter 23 upon the arrival of the clock pulse CLK.

In FIG. 7, a timing circuit and other devices for writing and reading the data in the RAM 20 are not shown. When the RAM 20 is of a synchronization type, the actual writing and reading operations have to be performed when the inputting of all the input signals to the data-input-terminal DI, the address-terminal ADR, and the write-terminal WT of the RAM 20 has been completed and a certain stabilization has been attained with respect to the inputting of those signals. Therefore, a timing circuit for such operation is required. Furthermore, in the case where the RAM 20 is of a non-synchronization type which starts writing operation upon inputting of a signal, that signal, for example, to the write-terminal WT, has to be input to the write terminal WT after the data and address have been input to the RAM 20 and a certain stabilization has been attained. Therefore, a delay circuit is required for such operation. Instead of using such a delay circuit, a RAM of the type capable of starting the writing operation at the trailing edge of each clock pulse CLK can also be employed.

The only difference between the conventional shift register shown in FIG. 4 and the abovve-mentioned embodiment of a shift register according to the present invention shown in FIG. 7 is that, in the embodiment in FIG. 7, the number of words, n, that can be stored in the RAM 20 is $n \leq l = 2^k$.

It is assumed that the data that has been written in the RAM 20 immediately after a clock pulse CLK is input to the RAM 20 has been written at the time j=0, where $0 \leq j < n$ and j is an integer. Referring to FIG. 7, the value j is described as the address SFTD ADR of a shifted data.

When the address strobe signal ADR STB is input to the clock-terminal CP of the latch 22, the address j of the data shifted at that moment is latched by the latch 22 and the output signal of the latch 22 is input to the adder 24. In the adder 24, as mentioned previously, the address indicated by the counted-down counter 23 (which corresponds to the address to be indicated by the pointer PNT) and the output of the latch 22 (which is the address j of the shifted data) are added, and the addition result is input to the address-terminal ADR of the RAM 20. In this case, the output of the adder 24 is of k-bits and overflow of the addition result is neglected. Therefore, in this addition, the calculation of [modulo $2^k$ addition] is performed. As mentioned above, the addition result is input to the address-terminal ADR of the RAM 20 and the content at the address is output from the data-output-terminal DO of the RAM 20. This output is the shifted data SFT DATA.

In a conventional procedure, in order to perform the modulo n addition, where $n \neq 2^k$, it is required that n be subtracted from the output of the adder when the output of a rear portion of the adder is more than n. Therefore, in the conventional procedure, a comparator for comparing n with the output of the adder, a subtracter for subtracting n from the output of the adder, and a selector for selecting either the output of the subtracter or the output of the adder are required.

In contrast to this, in the embodiment of a shift register according to the present invention in FIG. 7, the above-mentioned circuits are not required.

In the embodiment shown in FIG. 7, the counter 23 is a down-counter. However, a $2^k$-step up-counter, which is capable of performing one increment each time a clock pulse CLK is input thereto, can also be used. When such a $2^k$-step up-counter is employed, the same operation can be performed by replacing the adder 24 with a subtracter. This subtracter serves to subtract the output of the up-counter from the output of the latch 22. In this case, the number of bits of the input and output data is k and the underflow of the result of the operation is neglected.

Figure 8:
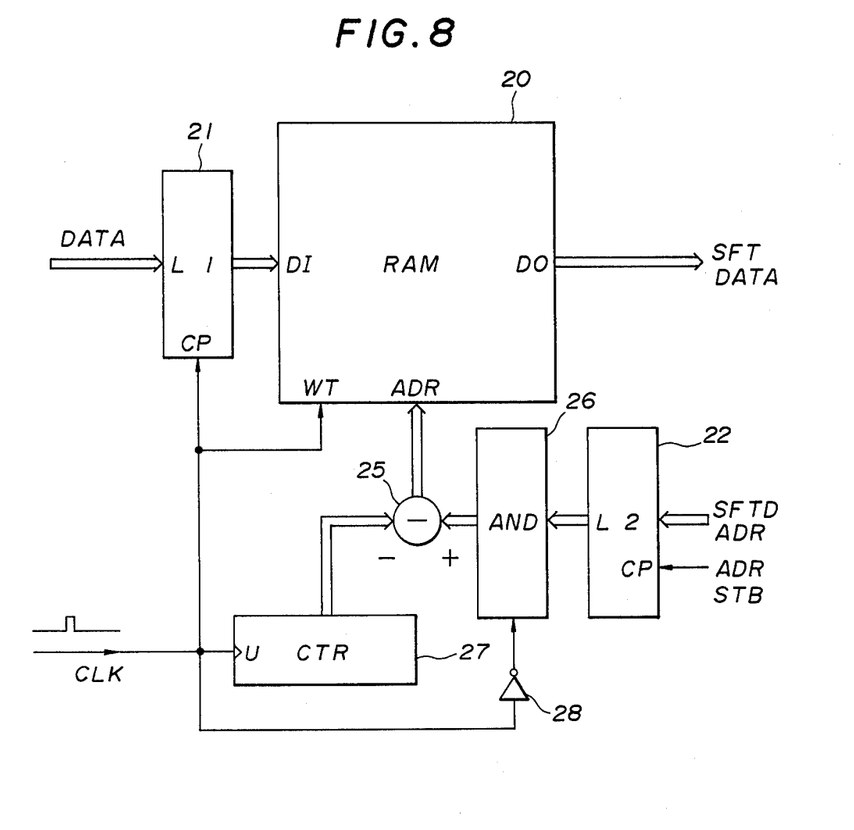
FIG. 8 is a block diagram of another embodiment of a shift register according to the present invention.

Referring to FIG. 8, there is shown a block diagram of another embodiment of a shift register according to the present invention.

In the embodiment of the shift register shown in FIG. 8, the down-counter 23 and the adder 24 shown in FIG.

7 are respectively replaced with an up-counter 27 and a subtracter 25. Further, in FIG. 8 an AND gate 26 is closed by a clock pulse CLK which passes through an inverter 28, whereby the signal to be input to the subtracter 25 is made "0." Therefore, when the clock pulse CLK is "0," the clock pulse CLK is inverted by the inverter 28 to "1," so that the AND gate 26 is opened by the inverted clock pulse CLK and the output of the latch 22 is directly input to the subtracter 25.

Figure 9:
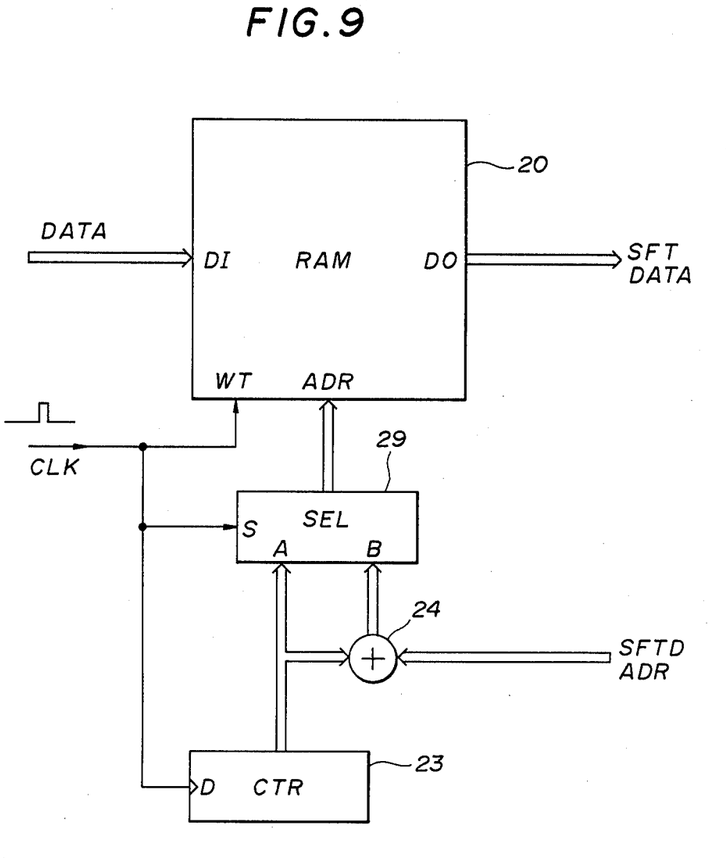
FIG. 9 is a block diagram of a further embodiment of a shift register according to the present invention.

Referring to FIG. 9, there is shown a block diagram of a further embodiment of a shift register according to the present invention.

In FIG. 9, the latches 21 and 22 as shown in FIG. 7 and FIG. 8 are not shown.

In the shift register shown in FIG. 9, a selector 29 is provided in order to input the output signal of the counter 23 directly to the address-terminal ADR of the RAM 20 when a clock pulse CLK is input thereto. When the clock pulse CLK is input to a select-terminal S of the selector 29, the selector 29 selects an input A, and the output of the selector 29 is applied to the address-terminal ADR of the RAM 20. On the other hand, when the clock pulse CLK is not input to the select-terminal S of the selector 29, the selector 29 selects an input B.

In the embodiments of the shift registers according to the present invention shown in FIG. 7 to FIG. 9, the absolute addresses are used as the addresses of the RAM 20. However, relative addresses can also be adopted by use of the desired blocks in a large capacity RAM. In order to do this, the value indicated by a base pointer (a base register) is added to the output of an adder (or a subtracter). In this method, the RAM can be shared with other instruments.

Figure 10:
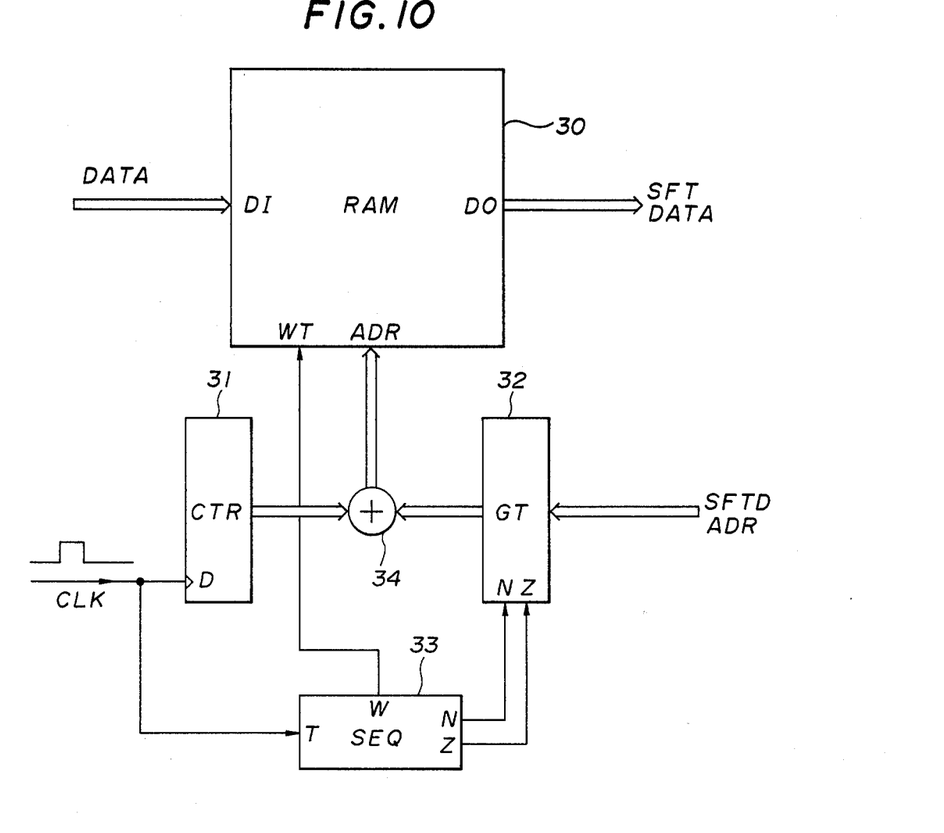
FIG. 10 is a block diagram of a still further embodiment of a shift register according to the present invention.

Referring to FIG. 10, there is shown a block diagram of a further embodiment of a shift register according to the present invention.

In this embodiment, a n-step shift register is employed, which comprises a RAM 30 having a memory capacity of more than 2n words, a n-step down-counter 31, a gate 32 which serves as a constant generator, a sequence control signal generator 33 and an adder 34.

To the address-terminal ADR of the RAM 30, there is applied an input which designates the address of the RAM 30 for reading and writing of data, and the content at the designated address of the RAM 30 is read and output from a data-output-terminal DO of the RAM 30. Further, a write command signal is input to a write-terminal WT of the RAM 30 and the data DATA input to a data-input-terminal DI is written at the address designated by the input to the address-terminal ADR.

A counter 31 can indicate the count values from 0 to $n-1$ and counts down one by one each time a clock pulse CLK is input thereto. If a clock pulse CLK is input to the counter 31 when the count value of the counter 31 is 0, the count value of the counter 31 becomes $n-1$. The output of the counter 31 is applied to an adder 34.

A sequence control signal generator 33 can generate its predetermined outputs at terminals W, N and Z of the sequence control generator 33 when a clock pulse CLK is input to a timing-terminal T of the sequence control signal generator 33.

A constant generator 32 does not generate a constant when the inputs to the terminals N and Z are both 0, so that the address SFTD ADR of a shifted data is directly output from the constant generator 32 and input to the adder 34. On the other hand, when the input to the terminal N is "0" and the input to the terminal Z is "1," the constant generator 32 outputs constant "0" to the adder 34. Further, when the inputs to the terminals N and Z are both "1," the constant generator 34 inputs a constant "n" to the adder 34.

Figure 11:
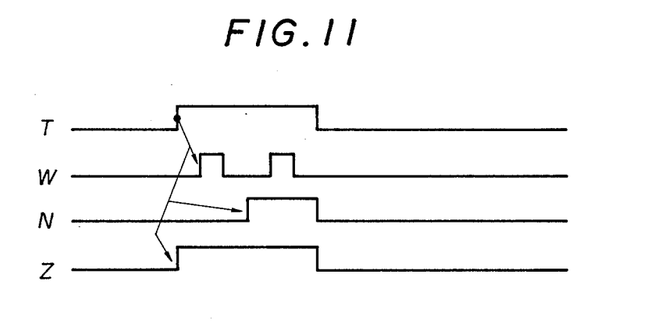
FIG. 11 is a time chart in explanation of each output from a sequence control apparatus in the shift register in FIG. 10.

Referring to FIG. 11, there is shown a time chart of each output from the sequence control signal generator 33 shown in FIG. 10.

When a clock pulse CLK is input to the timing terminal T of the sequence-control-signal-generator 33, the output is generated from the terminal Z with the timing of the leading edge of the clock pulse CLK, and after a predetermined delay time, the outputs are generated from the terminals W and N.

With the timing of the trailing edge of the clock pulse CLK, the outputs from the terminals N and Z trail. On the other hand, two pulses are generated from the terminal W while the clock pulse CLK is being input to the sequence-control-signal-generator 33.

Figure 12:
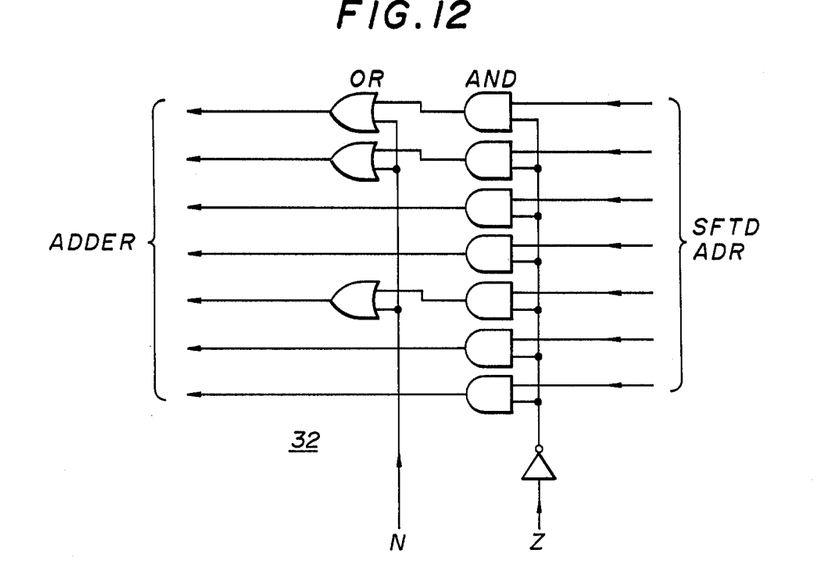
FIG. 12 is a block diagram of a constant generation apparatus of the shift register in FIG. 10.

Referring to FIG. 12, there is shown a block diagram of the constant-generator in FIG. 10.

In FIG. 12, the number of steps, n, is 100 ($n=100$), and in the case of 7 bits, addresses of 100 words can be designated. The output from the terminal Z of the sequence-control-signal-generator 33 is reversed and input to each of AND gates of 7 bits and, at the same time, the output from the terminal N of the sequence-control-signal-generator 33 is also applied to OR gates with the weights of $2^6$, $2^5$ and $2^2$ bits of the constant-generator 32.

An ADDER 34 adds the output of the counter 31 to the output of the gate 32 which serves as the constant-generator, inputting the added output to the address terminal ADR of the RAM 30.

When a clock pulse CLK is input to the counter 31, the counter 31 is counted down and it is assumed that the count value of the counter 31 is "i" at that moment. By the clock pulse CLK, the sequence-control-signal-generator 33 produces signals from the terminals W, N and Z (hereinafter referred to signals W, N and Z) with the respective timings as shown in FIG. 11.

As shown in FIG. 11, when the signal Z becomes "1" by the input of the clock pulse CLK, the signal N remains "0," with the result that the gate 32 in FIG. 12 generates a constant "0."

The adder 34 adds the output "i" of the counter 31 to the output "0" of the gate 32, and the added result is input to the address terminal ADR of the RAM 30. Thus, at this moment, the RAM 30 refers to the address "i."

Then the signal W becomes "1" under the condition that the signal Z is "1" and the signal N is "0" in the sequence-control-signal-generator 33, so that the signal W is output to the write-terminal WT of the RAM 30. As a result, the RAM 30 writes the data DATA at the address "i," which data DATA has been input to the data input-terminal DI of the RAM 30.

When both the signals N and Z become "0" after the signal W becomes "0," only the outputs of the OR gates of the gate 32 in FIG. 12 becomes "1" and by the output of $2^6$, $2^5$ and $2^2$, a constant $n=100$ is generated, which is input to the adder 34.

By the adder 34, the output i of the counter 31 is added to the output $n=100$ of the gate 32, and the addition result, $i+n$, is input to the address-terminal ADR of the RAM 30. Stated differently, the RAM 30 refers to the address $(i+n)$.

When the signal W becomes "1" again under the condition that both the signals N and Z are "1" in the sequence-control-signal-generator 33, the RAM 30 writes the same input data DATA as the input data DATA, which has been written at the address "i," at the address "i+n."

Figure 13:
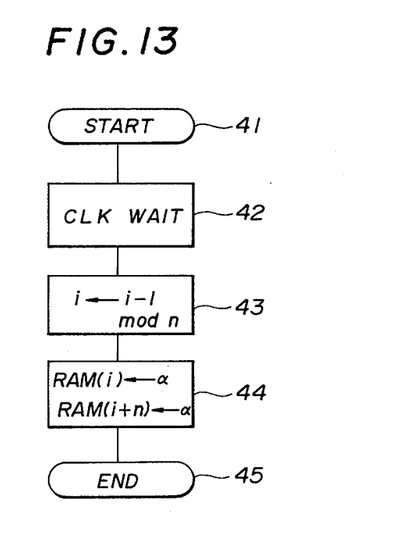
FIG. 13 is a flow chart in explanation of the operation of the shift register in FIG. 10.

Referring to FIG. 13, there is shown a flow chart of the operation of the shift register shown in FIG. 10. As shown in the figure, at stage 41, the operation is started and, at stage 42, the input of the clock pulse CLK is waited for. At stage 42, one decrement is performed with respect to the content of the counter 23 by the clock pulse CLK input thereto. Specifically, if the content of the counter 23 before such decrement is performed is i, the content thereof becomes i−1 after the decrement. At stage 44, an input data α is written simultaneously at the address (i+n) of the RAM 30. In this case, the data j clock pulses prior to the instant clock pulse is the data at the address (i+j) of the RAM 30.

Referring to FIG. 11 and FIG. 12, when the clock pulse CLK trails and the writing operation into the RAM 30 is completed, both the signals N and Z become "0" and the 7 AND gates in the gate 32 are all opened, so that the address j of the shifted data directly passes the gate 32 and is then input to the adder ADDER 34, where j is $0 \leq j < n$ and an integer. The data which is written in the RAM immediately after the input of the clock pulse CLK has the address j=0.

Referring back to FIG. 10, the value j is described as the address SFTD ADR of the shifted data.

In the adder 34, the output i of the counter 31 is added to the output j of the gate 32 and the addition result i+j is input to the address terminal ADR of the RAM 30, whereby the content at the address (i+j) is read in the RAM 30 and the shifted data SFT DATA is output from the data-output-terminal DO of the RAM 30.

In FIG. 10, when the signal N is "0" and the signal Z is "1," the constant 0 is generated from the gate 32 and the output "i" of the counter 31 and the constant "0" are added by the adder 34, whereby the addition result i+0 is obtained. However, instead of adding the constant "0" to the output "i" of the counter 31, a selector capable of inputting the output "i" directly to the address-terminal ADR of the RAM 30 can be employed. More specifically, such a selector is disposed between the adder 34 and the RAM 30, and when the signal Z is "0," the selector selects the output from the adder 34, while when the signal Z is "1," the selector selects the output of the counter 31, so that the selected output signal is input to the address-terminal ADR of the RAM 30.

In the embodiment of a shift register shown in FIG. 10, the counter 31 is a down-counter. Instead of the down-counter, an n-step up-counter can also be employed which is capable of performing one increment each time a clock pulse CLK is input thereto. When such an up-counter is employed, a subtracter is employed instead of the adder 34, whereby the same operation as in the case of employing the adder 34 is performed. The subtracter can subtract the output of the counter 31 from the output of the gate 32. In the case where the counter 31 is an up-counter which can count from $-(n-1)$ to 0, the result is exactly the same as in the shift register shown in FIG. 10.

If the counter 31 is an up-counter which can count from 0 to n−1, the up-counter has access of the address lower by (n−1) addresses than the counter in FIG. 10. However, the same result can be obtained except for the change of the access address. If it is inconvenient to have the negative addresses, a negative address can be changed to a positive address by applying such a bias as to add a constant more than n−1 to the adder 34. Furthermore, by use of absolute addresses in a conventional way, it is possible to have access to exactly the same address as in the case of the shift register shown in FIG. 10.

In this embodiment of the shift register according to the present invention, the absolute addresses are used as the addresses of the RAM 30. However, relative addresses can also be adopted by use of the desired blocks in a large capacity RAM. In order to do this, the value indicated by a base pointer (a base register) is added to the output of the adder 34, whereby the RAM 30 can be shared with other instruments.

In the conventional procedure where $n \neq 2^k$, in order to perform the modulo n addition, it is required that n be subtracted from the output of the adder when the output of a rear portion of the adder is more than n. Therefore, in the conventional procedure, a comparator for comparing n with the output of the adder, a subtractor for subtracting n from the output of the adder, and a selector for selecting either the output of the subtracter or the output of the adder are required.

In this embodiment of the shift register according to the present invention, the same data is written in the two addresses of the RAM, which are located apart from each other by n addresses and the data is successively stored in the addresses from i to (i+n). Therefore, the calculation of modulo n is not required with respect to the output of the adder. Therefore, the previously mentioned selector, subtracter and other circuits are unnecessary.

Thus, according to the present invention, the shift operation is possible only by changing the pointer (counter) and using a large memory capacity RAM, and the calculation of modulo n is not required for having access of the shifted data, whereby high speed shift operations can be performed and the input of the clock pulse can be stopped as desired.

What is claimed is:

1. A shift register of the type capable of performing shift operations by changing the access of a random access memory comprising:
   a random access memory having a memory capacity of $2^k$ words,
      where $2^k \geq n$ and n is the number of steps required for said shift register;
   a k-bit counter adapted to perform a counting operation when a clock pulse is input thereof an then to input, via a k-bit operation unit, the count output to said random access memory as an address for writing an input data in said random access memory; and wherein
   said k-bit operation unit is adapted to perform an operation with respect to said count output of said k-bit counter and the address of desired shifted data and then to output the operated result as an address for reading said shifted data from said random access memory, whereby high speed reading operation of said shifted data is attained.

2. A shift register as claimed in claim 1, wherein said k-bit counter is a down-counter which is counted down by a clock pulse input thereto, and said k-bit operation unit is a k-bit adder.

3. A shift register as claimed in claim 1, wherein said k-bit counter is an up-counter which is counted up by a clock pulse input thereto, and said k-bit operation unit is a k-bit subtracter.

4. A shift register of the type capable of performing shift operations by changing the access of a random access memory comprising:
- $2^n$ words, where n is the number of steps required for said shift register;
- a counter, the input of which is a clock pulse;
- a sequence control signal generation means for generating a sequence control signal in accordance with each clock pulse input thereto;
- a constant generation means for generating successively a first constant 0 and a second constant n in accordance with said sequence control signal and, in the absence of the input of said sequence control signal, generating the address of desired shifted data (SFTD DATA) input to said constant generation means as is; and
- an operation means for performing an operation with respect to either one of said first and second constants 0 and n, which are outputs of said constant generation means, and with respect to the output of said counter so as to generate first and second addresses successively for writing an input data in different addresses of said random access memory twice when the clock pulse is input thereto, whereby high speed reading operations of said shifted data is attained.

5. A shift register as claimed in claim 4, wherein said constant generation means comprises a plurality of AND gates which are inhibited by a first sequence control signal which is input thereto from said sequence control signal generation means, the input to said AND gates being the address of said shifted data, and a plurality of OR gates, one input to said OR gates being at least one output from said plurality of AND gates, and the other input to said OR gates being a second sequence control signal from said sequence control signal generation means.

* * * * *